United States Patent
Linn et al.

(10) Patent No.: US 9,438,994 B2
(45) Date of Patent: Sep. 6, 2016

(54) INSTRUMENT AMPLIFICATION SYSTEMS INCORPORATING REFLECTION CANCELLING BOUNDARY MICROPHONES AND MULTIBAND COMPRESSION

(71) Applicants: Thomas Linn, San Luis Obispo, CA (US); Lloyd Baggs, Nipomo, CA (US)

(72) Inventors: Thomas Linn, San Luis Obispo, CA (US); Lloyd Baggs, Nipomo, CA (US)

(73) Assignee: Lloyd Baggs Innovations, LLC, Nipomo, CA (US)

( * ) Notice: Subject to any disclaimer, the term of this patent is extended or adjusted under 35 U.S.C. 154(b) by 88 days.

(21) Appl. No.: 14/162,657

(22) Filed: Jan. 23, 2014

(65) Prior Publication Data

US 2014/0205106 A1    Jul. 24, 2014

Related U.S. Application Data

(60) Provisional application No. 61/755,905, filed on Jan. 23, 2013.

(51) Int. Cl.
*G10H 1/00* (2006.01)
*H04R 3/02* (2006.01)
(Continued)

(52) U.S. Cl.
CPC .................. *H04R 3/02* (2013.01); *G10H 1/12* (2013.01); *G10H 3/186* (2013.01); *H03G 9/025* (2013.01);
(Continued)

(58) Field of Classification Search
CPC ......... G10H 3/146; G10H 3/18; G10H 3/186
USPC .......... 381/71.2, 118, 120, 122, 334, 111, 61
See application file for complete search history.

(56) References Cited

U.S. PATENT DOCUMENTS 4,361,736 A  11/1982  Long et al.
4,563,933 A   1/1986  Kim
(Continued)

FOREIGN PATENT DOCUMENTS

GB           1317112 A    5/1973

OTHER PUBLICATIONS

Anderson, Roger et al., "A Distant Micing Technique," dB Magazine, Apr. 1971, vol. 5, No. 4, pp. 29-31, Retrieved from http://www.preservationsound.com/wp-content/uploads/2014/04/Distant_Micing.pdf on Jul. 7, 2014.

*Primary Examiner* — Disler Paul
(74) *Attorney, Agent, or Firm* — KPPB LLP

(57) ABSTRACT

Instrument amplification systems incorporating reflection cancelling boundary microphones and multiband compression in accordance with embodiments of the invention are disclosed. In one embodiment, an amplification system includes a microphone configured to generate an audio signal based upon acoustic waves within the instrument including audio content within a low frequency band including a fundamental resonant frequency of the instrument, a middle frequency band including at least one harmonic frequency of the instrument, and an upper frequency band, where the frequency response characteristics of acoustic waves generated within the instrument in the low frequency band differ from the characteristics of acoustic waves generated outside of the instrument, and an electronic preamplifier system configured to provide the audio content within the low frequency band to a low frequency band amplification circuit that applies compression to provide audio content having frequency characteristics corresponding to the characteristics of acoustic waves generated outside of the instrument.

31 Claims, 8 Drawing Sheets

(51) Int. Cl.
  *H04R 3/04* (2006.01)
  *G10H 1/12* (2006.01)
  *H03G 9/02* (2006.01)
  *G10H 3/18* (2006.01)
  *H04R 1/46* (2006.01)

(52) U.S. Cl.
  CPC *H04R 3/04* (2013.01); *G10H 3/18* (2013.01); *H04R 1/46* (2013.01); *H04R 2430/01* (2013.01); *H04R 2430/03* (2013.01)

(56) References Cited

U.S. PATENT DOCUMENTS

| | | | |
|---|---|---|---|
| 5,491,839 A * | 2/1996 | Schotz | H04B 1/04 381/79 |
| 6,122,385 A | 9/2000 | Konno et al. | |
| 6,563,033 B1 * | 5/2003 | Porzilli | G10D 3/02 84/267 |
| 6,627,808 B1 * | 9/2003 | Coats | G10H 3/146 84/723 |
| 8,023,665 B2 * | 9/2011 | Schwartz | H03G 3/32 333/28 T |
| 8,989,399 B2 * | 3/2015 | Baggs | H04R 3/007 381/111 |
| 2003/0142833 A1 * | 7/2003 | Roy | H04R 27/00 381/73.1 |
| 2005/0063553 A1 | 3/2005 | Ozawa | |
| 2006/0093158 A1 | 5/2006 | Noro | |
| 2007/0154037 A1 * | 7/2007 | Schwartz | H03G 3/32 381/118 |
| 2008/0205669 A1 | 8/2008 | Michelet | |
| 2009/0010453 A1 | 1/2009 | Zurek et al. | |
| 2009/0114080 A1 | 5/2009 | Uehara | |
| 2009/0175463 A1 | 7/2009 | Lee et al. | |
| 2010/0260347 A1 * | 10/2010 | Baggs | H04R 3/007 381/71.2 |

* cited by examiner

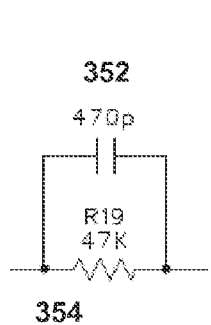
FIG. 9
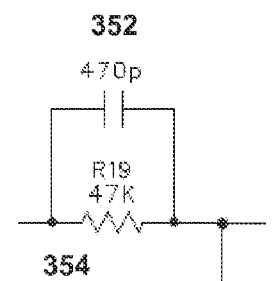
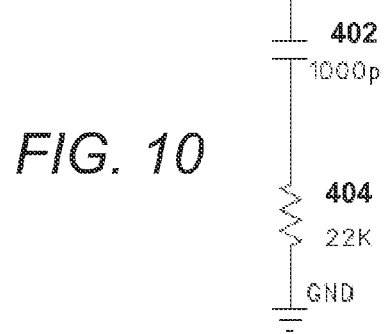
FIG. 10
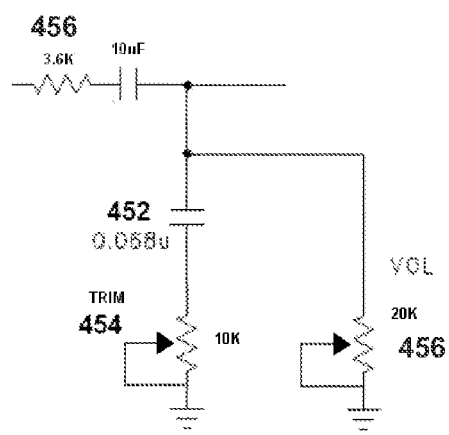
FIG. 11

INSTRUMENT AMPLIFICATION SYSTEMS INCORPORATING REFLECTION CANCELLING BOUNDARY MICROPHONES AND MULTIBAND COMPRESSION

CROSS-REFERENCE TO RELATED APPLICATIONS

The current application claims priority to U.S. Application No. 61/755,905, filed Jan. 23, 2013, the disclosure of which is incorporated herein by reference.

FIELD OF THE INVENTION

The present invention relates generally to amplification systems and more specifically to amplifiers for microphones that pick up sound from vibrating surfaces.

BACKGROUND OF THE INVENTION

Microphones are regarded as the highest fidelity and best method to record acoustic instruments. Artists performing with acoustic instruments have been limited in their ability to employ external microphones due to feedback, loud bands and the requirement to stay in one place. Microphones have been tried inside of acoustic instruments with limited success due to feedback and undesirable resonances present inside of the instruments.

In a number of instances, internal microphones have been paired with under saddle or magnetic pickups with some modest success. However, the microphone is used very sparingly to avoid such things as feedback and undesirable resonances. The Duet, manufactured by L.R. Baggs Corporation of Nipomo, Calif., was one of the first successful microphone/pickup combinations. The Duet uses a crossover tuned to 1500 Hz and blended the fundamental and first harmonic range of the pickup with the upper harmonics of the microphone. This system could be played at very high sound pressure levels (SPLs) without feedback and with good fidelity.

A variety of specialized microphones are used in other applications. For example, boundary microphones are used in applications including monitoring full room sound. A boundary microphone is characterized in that it is mounted within the "pressure zone" proximate a rigid boundary and generates a signal indicative of the totality of the ambient sound reflected by the boundary. Boundary microphones are described in U.S. Pat. No. 4,361,736 to Long et al., the disclosure of which is incorporated herein by reference in its entirety. Long et al. describe that placing the diaphragm of the microphone capsule parallel to and facing the plate boundary provided by the microphone package enables the microphone to completely remove unwanted variations in the spectra of the output signal in the selected frequency range due to the cancellation and additions which would otherwise be caused by the interaction of the direct acoustical signal and the acoustical signal reflected form the proximate boundary. Long et al. explain that this is due to the fact that the microphone is operated in a mode in which the microphone senses only the variation in acoustical pressure and cannot discriminate with respect to the direction or angle of incidence of the sound. Long et al. note that it is essential that the diaphragm be shielded from all acoustic signals except those reflected from the boundary.

Another type of microphone is a noise cancelling microphone, which is a microphone designed to filter out ambient noise from the desired sound. Noise cancelling microphones typically utilize a noise cancelling capsule that is very proximity sensitive and includes at least two ports, where the front port is oriented toward the desired sound and the other port is more distant. A noise cancelling capsule's diaphragm is typically placed between the two ports; sound arriving from an ambient sound field reaches both ports more or less equally. Sound that's much closer to the front port than to the rear will make more of a pressure gradient between the front and back of the diaphragm, causing it to move more. A noise cancelling microphone capsule's proximity effect can be adjusted so that a flat frequency response is achieved for sound sources very close to the front of the microphone. Noise cancelling microphone capsules were developed specifically for telecommunications applications such as cell phones, headset microphones, etc. where rejection of background noise is paramount.

There are also other types of non-microphone systems that have been developed to amplify an acoustic instrument. Many of these are intended to act similarly to microphones and many of them amplify similar bands of frequencies from an acoustic instrument as a microphone. Particularly devices referred to as Sound Board Transducers or SBTs have been developed sometimes with the intention of replacing a microphone to amplify an instrument.

An SBT is a type of transducer device that will turn the vibration from a vibrating surface into an electrical current while making contact with that surface. In comparison, a microphone will turn a vibration in the air into an electrical signal.

SUMMARY OF THE INVENTION

Instrument amplification systems incorporating reflection cancelling boundary microphones and multiband compression in accordance with embodiments of the invention are disclosed. In one embodiment, an instrument amplification system includes a microphone mounted to a stringed acoustic musical instrument and configured to generate an audio signal based upon acoustic waves within the interior of the stringed acoustic musical instrument, where the audio signal includes audio content within a number of frequency bands including at least a low frequency band that includes a fundamental resonant frequency of the stringed acoustic musical instrument, a middle frequency band that includes frequencies higher than the frequencies of the low frequency band and includes at least one harmonic frequency of the stringed acoustic musical instrument, and an upper frequency band that includes frequencies higher than the frequencies of the middle frequency band, where the frequency response characteristics of acoustic waves generated within the stringed acoustic musical instrument in at least the low frequency band differ from the frequency response characteristics of acoustic waves generated outside of the stringed acoustic musical instrument in the same frequency band due to reverberation of acoustic waves within the low frequency band within the stringed acoustic musical instrument, and an electronic preamplifier system configured to receive the audio signal, provide portions of the audio signal to a number of amplification circuits, where audio content within one of the frequency bands in the audio signal is provided to each amplification circuit, and combine the outputs of the amplification circuits into an output signal, where the audio content within the low frequency band is provided to a low frequency band amplification circuit from the amplification circuits that applies frequency specific compression to the given frequency band to provide audio content in the low frequency band having frequency characteristics corresponding to the frequency response characteristics of acoustic waves generated outside of the stringed musical instrument in the low frequency band.

In a further embodiment, the microphone is configured to be mounted inside the chamber of the stringed acoustic musical instrument.

In another embodiment, the microphone includes a capsule configured to be mounted within the pressure zone of a vibrating surface of the stringed acoustic musical instrument.

In a still further embodiment, the microphone capsule includes a reflection cancelling boundary microphone (RCBM).

In still another embodiment, the middle frequency band includes the primary resonant frequency of the microphone capsule.

In a yet further embodiment, the microphone capsule is mounted to an inside surface of the stringed acoustic musical instrument.

In yet another embodiment, the electronic preamplifier system is mounted to the stringed acoustic musical instrument.

In a further embodiment again, the electronic preamplifier system is not mounted to the stringed acoustic musical instrument.

In another embodiment again, the low frequency band amplification circuit includes a soft knee limiter.

In a further additional embodiment, the middle frequency band includes the 3-6 kHz frequency band and the corresponding amplification circuit from the amplification circuits includes a compressor to reduce the dynamic range of audio content in the 3-6 kHz frequency band.

In another additional embodiment, the audio signal also includes audio content within a second low frequency band that includes frequencies higher than the frequencies of the low frequency band, and a second middle frequency band that includes frequencies higher than the frequencies of the second low frequency band and lower than the frequencies of the middle frequency band, and the amplification circuits include a soft knee peak limiter that reduces the dynamic range of audio content within the low frequency band, a soft knee root-mean-square compressor that reduces the dynamic range of audio content within the second low frequency band, a middle frequency compressor that reduces the dynamic range of audio content within the second middle frequency band, and a shelving filter that provides a fixed reduction in the level of audio content within the middle frequency band.

In a still yet further embodiment, the amplification circuits also includes a first high pass filter and a first high and middle frequency bypass, where the high pass filter is configured to receive a portion of the audio signal and send a filtered audio signal to the soft knee peak limiter and the high and middle frequency bypass, and the first high and middle frequency bypass is configured to receive a filtered audio signal from the high pass filter and bypass a band of high and middle frequencies of the filtered audio signal from entering the soft knee limiter.

In still yet another embodiment, the high pass filter has a cutoff of 70 Hz and the first high and middle frequency bypass has a cutoff of 250 Hz.

In a still further embodiment again, the amplification circuits also includes a second high and middle frequency bypass, where the soft knee root-mean-square compressor and the second high and middle frequency bypass are configured to accept a modified audio signal from the soft knee peak limiter, and the second high and middle frequency bypass is configured to bypass audio content within a band of high and middle frequencies of the modified audio signal from entering the soft knee root-mean-square compressor.

In still another embodiment again, the second high and middle frequency bypass has a cutoff of 200 Hz.

In a still further additional embodiment, the amplification circuits also includes a very high frequency bypass, where the mid frequency compressor is configured to accept a modified audio signal from the soft knee root-mean-square compressor, and the very high frequency bypass is configured to bypass audio content within a band of very high frequencies from entering the middle frequency compressor and the shelving filter.

In still another additional embodiment, the very high frequency bypass has a cutoff of 10 kHz.

In a yet further embodiment again, the amplifications circuits also includes a middle frequency bypass configured to bypass audio content within frequencies in a passband of 250 Hz to 3 kHz from entering the middle frequency compressor and the shelving filter.

In yet another embodiment again, the stringed acoustic musical instrument is a six string acoustic guitar and at least a portion of the low frequency band falls within the frequency range of 70 Hz to 250 Hz.

In a yet further additional embodiment, the soft knee peak limiter includes a first Zener diode that is reverse biased against a second Zener diode and a resistor in series.

In yet another additional embodiment, the stringed acoustic musical instrument is a six string acoustic guitar and at least a portion of the second low frequency band falls within the frequency range of 70 Hz to 200 Hz.

In a further additional embodiment again, the soft knee root-mean-square compressor includes an op-amp having a constant voltage at its non-inverting input, a first diode and a second diode forming a precision rectifier joining the output and inverting input of the op-amp, and a junction gate field effect transistor (JFET), where the state of the JFET is based on the output of the second diode.

In another additional embodiment again, the stringed acoustic musical instrument is a six string acoustic guitar and at least a portion of the second middle frequency band falls within the frequency range of 3 to 6 kHz.

In a still yet further embodiment again, the middle frequency compressor includes a first diode that is reverse biased against a second diode in parallel, and a gyrator circuit including an op-amp with an RC differentiating circuit connected to the non-inverting input of the op-amp.

In still yet another embodiment again, the stringed acoustic musical instrument is a six string acoustic guitar and at least a portion of the middle frequency band falls within the frequency range of 1 kHz to 20 kHz.

In a still yet further additional embodiment, the shelving filter includes a first resistor and a first capacitor in parallel, and a second resistor and a second capacitor in series.

In still yet another additional embodiment, the audio signal also includes audio content within a third middle frequency band, where at least a portion of the third middle frequency band falls within the frequency range of 50 to 65 Hz, and the instrument amplification system also includes a notch filter that significantly reduces the level of audio content within the seventh middle frequency band.

A yet further additional embodiment again also includes a trim control including a trim potentiometer and capacitor configured to adjust the level of audio content in the upper frequency band relative to the level of audio content in the low frequency band and the middle frequency band.

In yet another additional embodiment again, the frequency response characteristics of acoustic waves generated within the stringed acoustic musical instrument in at least the middle frequency band differ from the frequency response characteristics of acoustic waves generated outside of the stringed acoustic musical instrument in the same frequency band due to reverberation of acoustic waves within the middle frequency band within the stringed acoustic musical instrument, and the audio content containing the middle frequency band is provided to a middle frequency band amplification circuit from the amplification circuits that applies frequency specific compression to the given frequency band to provide audio content in the middle frequency band having frequency characteristics corresponding to the frequency response characteristics of acoustic waves generated outside of the stringed musical instrument in the middle frequency band.

In still another further embodiment, the low frequency band amplification circuit from the plurality of amplification circuits also applies frequency specific limiting to the low frequency band to provide audio content in the low frequency band having frequency characteristics corresponding to the frequency response characteristics of acoustic waves generated outside of the stringed musical instrument in the low frequency band.

In a still yet further additional embodiment again, an instrument amplification system including a microphone mounted to the stringed acoustic musical instrument and configured to generate an audio signal based upon acoustic waves outside the stringed acoustic musical instrument, where the audio signal includes audio content within a number of frequency bands including at least a low frequency band that includes a fundamental resonant frequency of the stringed acoustic musical instrument, a middle frequency band that includes frequencies higher than the frequencies of the low frequency band and includes at least one harmonic frequency of the stringed acoustic musical instrument, and an upper frequency band includes frequencies higher than the frequencies of the middle frequency band, where the frequency response characteristics of acoustic waves generated outside of but within the predetermined distance from the stringed acoustic musical instrument in at least the middle frequency band differ from the frequency response characteristics of acoustic waves generated outside of the stringed acoustic musical instrument greater than the predetermined distance in the same frequency band, and an electronic preamplifier system configured to receive the audio signal, provide portions of the audio signal to a number of amplification circuits, where audio content within one of the frequency bands in the audio signal is provided to each amplification circuit, and combine the outputs of the amplification circuits into an output signal, where the audio content within the middle frequency band is provided to a middle frequency band amplification circuit from the amplification circuits that applies frequency specific compression to the given frequency band to provide audio content in the middle frequency band having frequency characteristics corresponding to the frequency response characteristics of acoustic waves generated outside of the stringed musical instrument in the middle frequency band.

A still yet another additional embodiment again also includes a trim control including a trim potentiometer and capacitor configured to adjust the level of audio content in the upper frequency band relative to the level of audio content in the low frequency band and the middle frequency band.

In another further embodiment, the frequency response characteristics of acoustic waves generated within the stringed acoustic musical instrument in at least the low frequency band differ from the frequency response characteristics of acoustic waves generated outside of the stringed acoustic musical instrument in the same frequency band due to reverberation of acoustic waves within the low frequency band within the stringed acoustic musical instrument, and the audio content containing the low frequency band is provided to a low frequency band amplification circuit from the amplification circuits that applies frequency specific compression to the given frequency band to provide audio content in the low frequency band having frequency characteristics corresponding to the frequency response characteristics of acoustic waves generated outside of the stringed musical instrument in the low frequency band.

In another further embodiment again, the middle frequency band amplification circuit from the plurality of amplification circuits also applies frequency specific limiting to the middle frequency band to provide audio content in the middle frequency band having frequency characteristics corresponding to the frequency response characteristics of acoustic waves generated outside of the stringed musical instrument in the middle frequency band.

BRIEF DESCRIPTION OF THE DRAWINGS

FIG. 9 is a circuit diagram illustrating a treble bypass that can be used in a preamp in accordance with an embodiment of the invention.

FIG. 10 is a circuit diagram illustrating a shelving filter that can be used in a preamp in accordance with an embodiment of the invention.

FIG. 11 is a circuit diagram illustrating a trim control that can be used in a preamp in accordance with an embodiment of the invention.

DETAILED DISCLOSURE OF THE INVENTION

Figure 1:
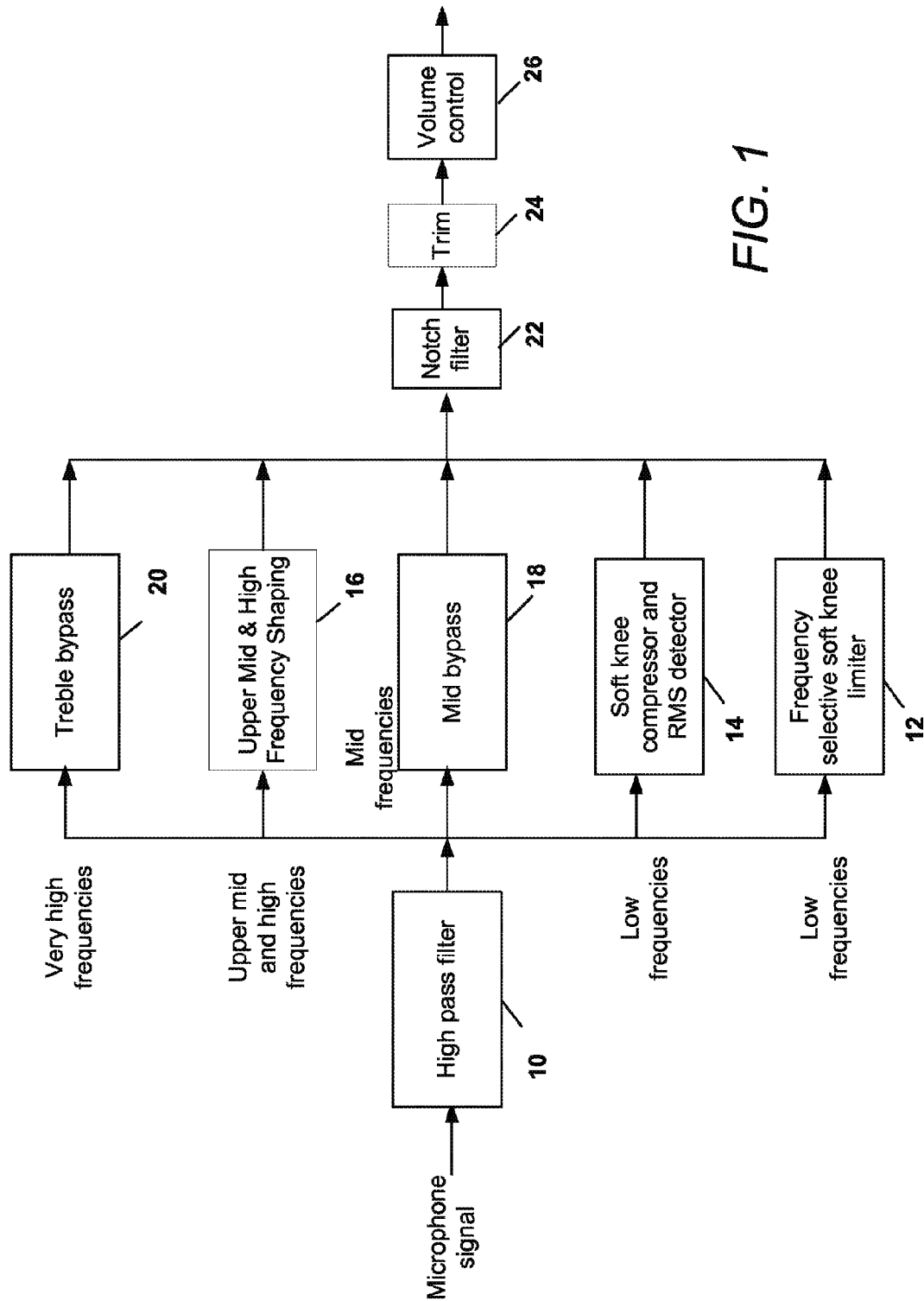
FIG. 1 is a conceptual diagram illustrating frequency and transient or dynamic shaping circuitry of a preamp in which components are arranged along parallel signal paths to shape various frequency bands in accordance with embodiments of the invention.

Turning now to the drawings, amplification systems incorporating preamplifiers (preamps) that accurately reproduce the dynamics of an instrument such as acoustic guitar in accordance with embodiments of the invention are illustrated. In several embodiments, the preamplifiers are utilized in amplification systems that include reflection cancelling boundary microphones or other types of transducers that attempt to capture the sound produced by the sound board of a musical instrument such as (but not limited to) an acoustic guitar. The term reflection cancelling boundary microphone or RCBM is used to describe a class of microphone in which the microphone capsule is mounted within the pressure zone of a vibrating surface and the microphone is tuned in such a way as to cancel pressure waves reflected by the surface while admitting pressure waves generated by the vibration of the surface. The terms cancel and cancelling here are used to refer to the ability of the microphone to reduce the contribution of reflections to the audio signal generated by the microphone and are not intended to necessarily imply the complete cancellation of any contribution from reflections (although in many instances this may in fact be the objective of an RCBM). The extent to which an RCBM reduces the contribution of reflections from the vibrating surface (i.e., the zero effect of the RCBM) to the audio signal generated by the microphone depends upon the tuning of the microphone. In a number of embodiments, the RCBM includes a noise cancelling capsule mounted facing the vibrating surface in the pressure zone of the vibrating surface. Where a greater contribution from reflected sound is desired in the audio signal, other types of capsules can be used including but not limited to unidirectional, cardioid, or omni capsules and including multiple capsules in various phase relationships. In many embodiments, the microphone capsule is mounted in such a way as to filter mechanically borne vibrations in the operating range of the RCBM.

In many existing instrument pickup systems that use RCBMs, the signal from another type of pickup such as a magnetic, under saddle, transducer, or soundhole pickup or other type of microphone is combined with the signal from an RCBM. The combination is often desirable to supplement the audio signal from the RCBM in frequency ranges where it may be susceptible to feedback or other distortions or resonances that detract from an accurate representation of the instrument's sound.

An RCBM or other variety of transducer that is designed to capture the sound generated by the sound board of a stringed instrument can be combined with an electronic preamp (preamplifier) constructed in accordance with embodiments of the invention to accurately reproduce the dynamics of the instrument. Many instruments have properties due to materials or construction such that some frequencies are accentuated or exaggerated. In an acoustic guitar, this can occur at certain low and high frequencies. This resonance effect can cause sound at those frequencies to feed back when amplified.

In addition, low-end frequencies upon amplification can have a "woofy" unpleasant sound and high-end frequencies can have a harshness or "boxy" sound, as if the sound waves were resonating in a box as opposed to open air. One or more surfaces of a hollow acoustic musical instrument may have one or more resonant frequencies (e.g., fundamental and/or harmonic) that result in audio waves reverberating within the instrument to be accentuated at those frequencies. This effect is not as pronounced outside of the instrument and is minimized beyond a certain distance from the instrument. Other distortions can result from Helmholtz resonance. The audio waves inside the instrument may therefore have characteristics that are different from the audio waves outside the instrument. An audio signal generated based upon the audio waves by a transducer inside the instrument can be modified by amplification circuitry as will be discussed below to provide audio content having frequency response characteristics that correspond to the characteristics of audio waves outside the instrument.

Some microphones also have a resonance at certain frequencies (e.g. 7 kHz in some microphones) that can generate a high frequency peak. The fundamental frequency of the capsule of an RCBM is typically associated with the size of the capsule. In many embodiments of the invention, an RCBM preamp (i.e., an electronic preamplifier for use with an RCBM or other microphone) includes amplitude or volume modifying circuitry such as equalizers or compressors to reduce the effects of resonance and improve sound reproduction. As will be discussed below, an RCBM preamp may also include filters and/or frequency bypasses so that equalizers or compressors apply only to audio content within certain frequency ranges. In various embodiments of the invention, the frequency ranges may be tailored to the characteristics (e.g., fundamental frequencies, frequency response, etc.) of a specific instrument or type of instrument.

Some other types of instrument pickups such as Sound Board Transducers (SBTs) can reproduce similar characteristics to a microphone or an RCBM when used to amplify an acoustic instrument. In many embodiments of the invention, an RCBM preamp could also be used to shape the audio signal from an SBT that has similar but not necessarily the same response when amplifying an acoustic instrument. The frequency and dynamic shaping similar to an RCBM preamp would work well for this type of device.

Compression lowers the volume of loud sounds by reducing the dynamic range, or the ratio between the largest and smallest values, of audio content. The result is attenuation of the volume of loud sounds in a signal. Compressors may be of a feedback or feed-forward design and may utilize various components for variable gain amplification. Four basic parameters can be used to characterize compressors: compression ratio, threshold level, attack time and release time. Ratio is the degree to which the compressor reduces dynamic range. Threshold is the level of the incoming signal at which the compressor changes from a unity gain amplifier into a compressor reducing gain. Attack time refers to the time it takes the compressor to start compressing after the threshold has been reached. Release time is the time it takes for the compressor to return to unity gain after the input signal has fallen below the threshold. Certain compressors with a high ratio (commonly 8:1 to 10:1 or above) and, generally, a fast attack time may also be called limiters.

An equalizer typically provides a fixed reduction at target frequencies, whereas a compressor reduces values dynamically. Compression can be used to reduce the effects of resonance on causing feedback and shape the sound signature of an electronic component or amplifier. In many embodiments of the invention, selective compression is applied to particular bands of frequencies. Different types and degrees of compression can be used on different frequency bands. The frequency bands can be isolated using various types of filters. In some embodiments, one or more frequency bands are bypassed and not modified by compression, although they may be modified by volume, trim, or other controls that affect the entire signal. Various techniques can be used to select the frequency bands, such as high pass, low pass, or band pass filters. In some embodiments of the invention, frequency bands are mutually exclusive. In other embodiments, frequency bands may overlap at some frequencies. In many embodiments, some of the frequency bands are mutually exclusive and some of the frequency bands overlap at some frequencies.

In various embodiments of the invention, an RCBM preamp (preamplifier) includes frequency shaping circuitry that selectively applies compression to certain bands of frequencies. A conceptual diagram of an RCBM preamp in which frequency shaping components, including compressors, are arranged along parallel signal paths to process various frequency bands in accordance with embodiments of the invention is illustrated FIG. 1. The RCBM preamp can accept an audio signal from an RCBM or other instrument pickup and first pass the signal through a high pass filter 10. Using various arrangements of filters, some low frequencies (20 Hz to 250 Hz) are sent to a soft knee limiter 12, low frequencies (20 to 200 Hz) to an RMS (root-mean-square) compressor 14, upper mid (middle) and high frequencies to upper mid and high frequency shaping 16 (3 kHz to 10 kHz). Bypass circuits 18 and 20 are used to bypass mid frequencies 18 (250 Hz-3 kHz) and very high frequencies 20 (above 10 kHz) from processing. The outputs of components 12, 14, 16, 18, and 20 lead to a notch filter 22. Notch filter 22, trim control 24, and volume control 26 in series can be used to modify the signal before being output from the system.

Figure 3:
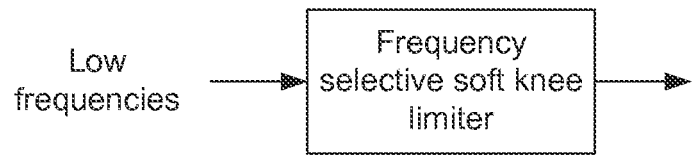
FIG. 3 is a conceptual diagram illustrating a low frequency soft knee limiter that can be used in a preamp in accordance with embodiments of the invention.
Figure 5:
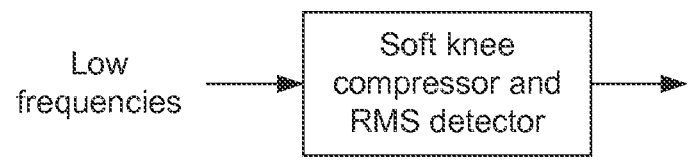
FIG. 5 is a conceptual diagram illustrating a low frequency RMS compressor that can be used in a preamp in accordance with embodiments of the invention.

The soft knee limiter 12 is a peak limiter that provides compression of peak values at the specified frequencies. Peak limiters in accordance with embodiments of the invention are discussed further below with respect to FIGS. 3 and 4. The RMS compressor 14 is a compressor that responds to the root-mean-square measure of the signal, i.e., over time. RMS compressors in accordance with embodiments of the invention are discussed further below with respect to FIGS. 5 and 6. The notch filter 22 removes signal contents at certain unwanted frequencies (around 60 Hz) and is discussed further below with respect to FIG. 12. The trim control circuit 24 can be used to balance the level of signal content at high frequencies with low frequencies and is discussed further below with respect to FIG. 11. The volume control circuit 64 can be used to adjust the overall level of the signal that is output from the system.

Figure 2:
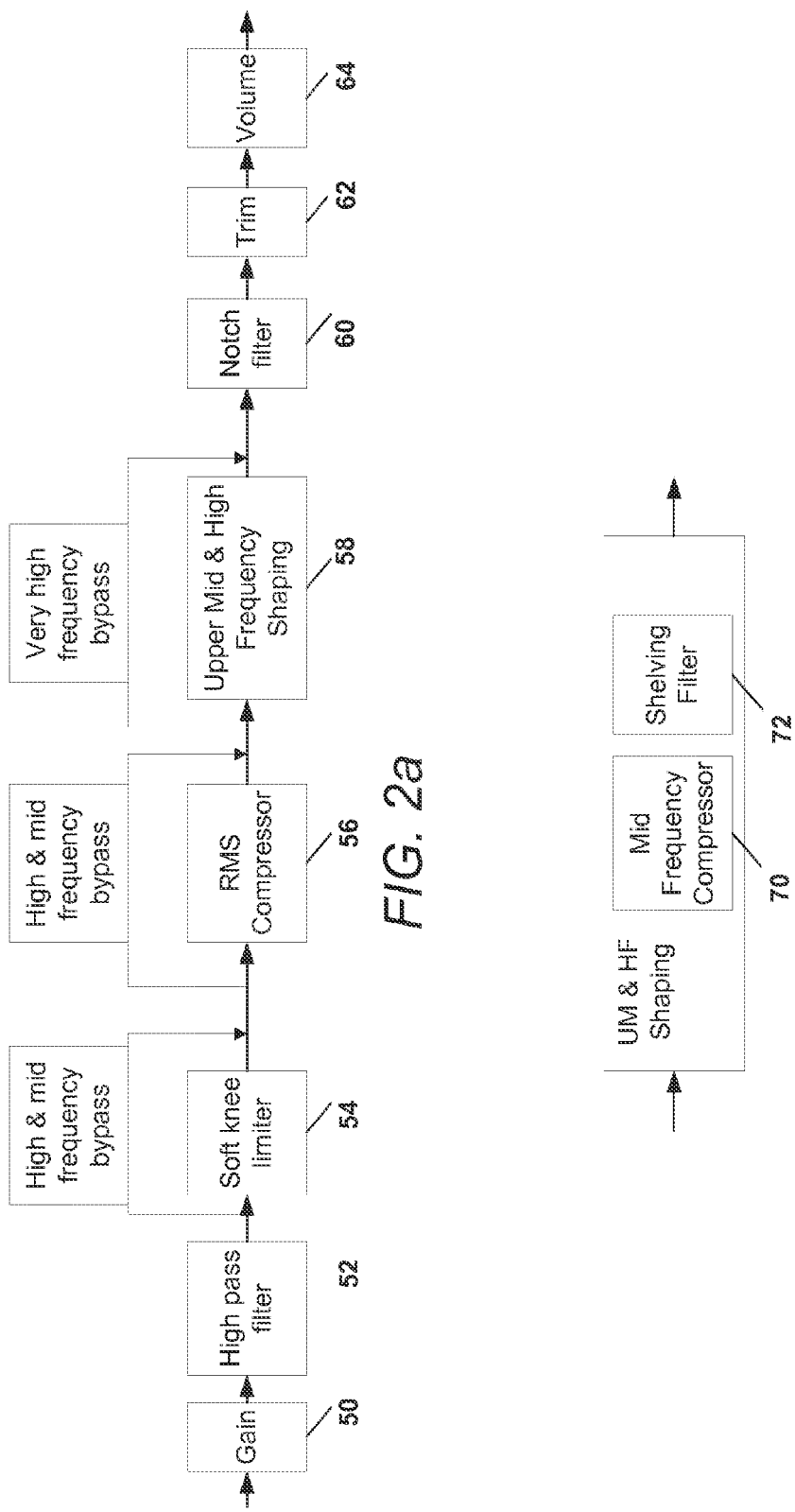
FIGS. 2a and 2b are conceptual diagrams illustrating frequency shaping circuitry of a preamp in which components are arranged along series signal paths to shape various frequency bands in accordance with embodiments of the invention.

In other embodiments of the invention, frequency shaping components in an RCBM preamp can be arranged along series signal paths. A conceptual diagram of an RCBM preamp in which components are arranged along a single main signal path to process various frequency bands in accordance with embodiments of the invention is illustrated in FIG. 2a. A signal is first received by a gain stage 50, which provides simple amplification to the signal. A high pass filter 52 with a cutoff of about 70 Hz then reduces most content in the signal below 70 Hz. Depending on the characteristics of the cutoff of the high pass filter 52, some content may remain above 20 Hz but to a lesser degree. Similar to the embodiments discussed above, the signal leads to a soft knee limiter 54, a RMS compressor 56 and upper mid and high frequency shaping 58 circuits. In the embodiment pictured in FIG. 2a the soft knee limiter 54, RMS compressor 56, and upper mid and high frequency shaping circuit 58 are placed in series—the soft knee limiter 54 having a high and mid frequency bypass (above 250 Hz), the RMS compressor 56 having a high and mid frequency bypass (above 200 Hz), and the upper mid and high frequency shaping circuit 58 having a very high frequency bypass (above 10 kHz). A notch filter 60, a trim control circuit 62, and a volume control circuit 64 in series after upper mid and high frequency shaping 58 can further modify the signal before being output from the system. As can be readily appreciated the discussion of relative frequency ranges can be related to a specific instrument or type of instrument. Accordingly, the specific frequencies that are bypassed and the frequencies that are affected by various compressors can vary depending upon the requirements of a specific instrument in accordance with embodiments of the invention.

Figure 8:
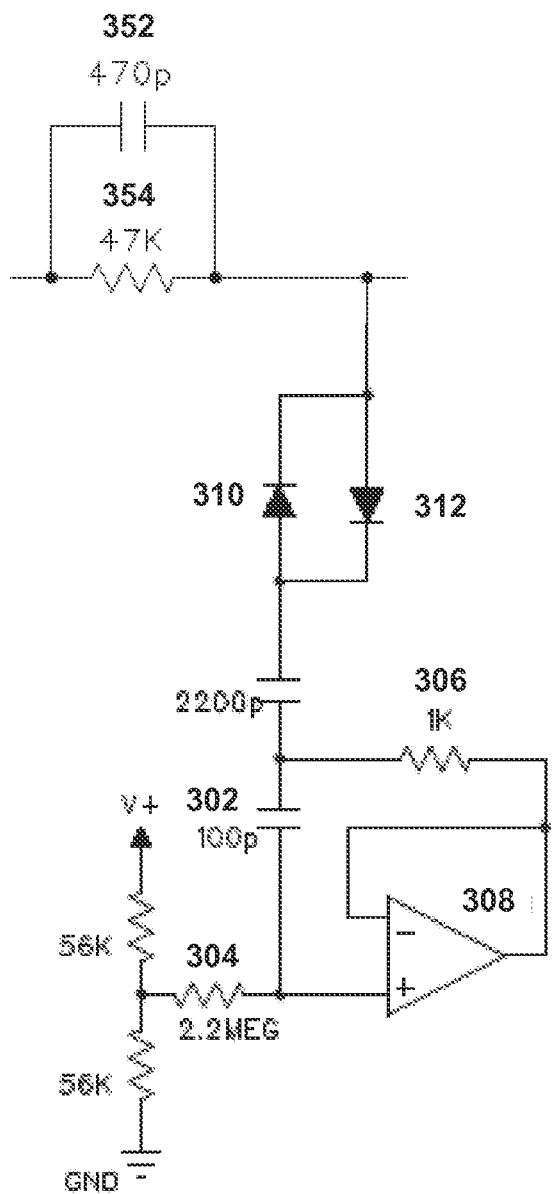
FIG. 8 is a circuit diagram illustrating a mid frequency compressor that can be used in a preamp in accordance with an embodiment of the invention.

An upper mid and high frequency shaping circuit similar to the circuits 16 and 58 shown in FIGS. 1 and 2a can further include a mid frequency compressor and shelving filter. An upper mid and high frequency circuit that includes a mid frequency compressor and shelving filter in accordance with embodiments of the invention is illustrated in FIG. 2b. The mid frequency compressor 70 adjusts the signal at frequencies at which human ears are particularly sensitive to high levels. Operation of mid frequency compressors in accordance with embodiments of the invention is discussed further below with respect to FIGS. 6 and 8. A shelving filter 72 can also be used to provide a fixed reduction in certain mid frequencies. Various shelving filters in accordance with embodiments of the invention are discussed further below with respect to FIG. 10.

While FIGS. 1, 2a, and 2b show a variety of compressors and other shaping circuits, some embodiments of the invention may not include all components and/or may pass slightly different frequency bands to individual components. One skilled in the art will recognize that amplification systems in accordance with embodiments of the invention may utilize components that are similar or equivalent to the components discussed herein. Circuit components of an RCBM preamp in accordance with embodiments of the invention can be implemented with class A circuitry. Limiters and compressors that can be utilized in an RCBM preamp and can be applied to selected frequency bands in accordance with embodiments of the invention are discussed in greater detail below.

Low Frequency Soft Knee Peak Limiter

For many acoustic guitars and other stringed instruments, a low frequency band of approximately 70 Hz to 250 Hz is important because the fundamental frequencies of vibration of strings and the fundamental resonances of the body of these instruments fall in this range. Thus, an audio signal carrying sound from the instrument contains a significant amount of energy at those frequencies. In many embodiments of the invention, the band of 70 Hz to 250 Hz is selected using filters. In other embodiments, the lower bound of the frequency band is a frequency between 70 Hz and 80 Hz and the upper bound is a frequency between 250 to 400 Hz. Some individual stringed instruments, even of the same type of instrument, such as a guitar, might have specific frequency bands that vary by model, make, tuning or due to any of a number of other factors related to the construction of the instrument that might require shaping of different frequency bands. In other stringed instruments, the fundamental range may extend lower. For instance, an acoustic bass guitar typically has a lower fundamental frequency range than a standard six-string acoustic guitar. As well, other stringed instruments may have a higher fundamental frequency range. For instance, a ukulele typically has a higher fundamental frequency range than a standard acoustic guitar.

In various embodiments of the invention, this band is selected using high pass filters and bypass filters. In some embodiments, a bandpass filter is used that includes a two pole high pass filter passing all frequencies above 70 Hz and a single pole bypass filter at 250 Hz.

In many embodiments of the invention, this band of frequencies is subjected to a frequency selective soft-knee peak limiter incorporating Zener diodes. As discussed above, a limiter is a type of compressor that generally has a high compression ratio and fast attack time. A frequency selective soft-knee peak limiter circuit that utilizes Zener diodes in accordance with embodiments of the invention is illustrated conceptually in FIG. 3 and in detail in FIG. 4.

Figure 4:
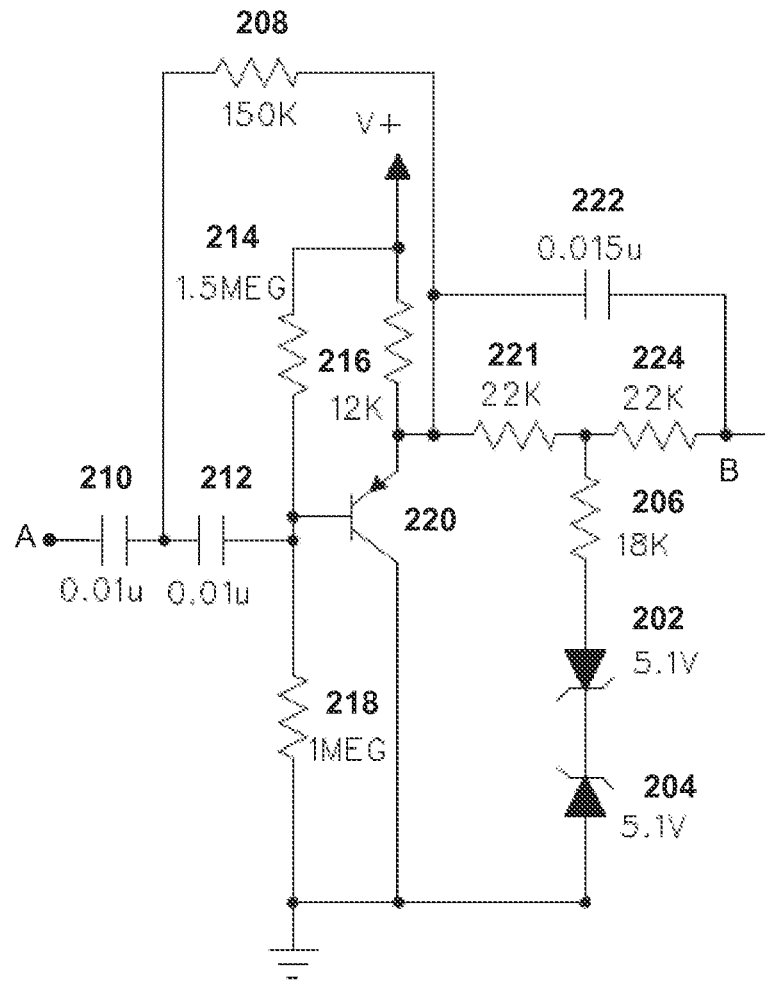
FIG. 4 is a circuit diagram illustrating a high pass filter and a low frequency soft knee limiter that can be used in a preamp in accordance with embodiments of the invention.

Referring now to FIG. 4, a first Zener diode 202 is reverse biased and placed back-to-back with a second Zener diode 204. In this formation, the pair of Zener diodes 202 and 204 form an AC regulator that attenuates the signal near the positive and negative values of the breakdown voltage of the Zener diodes. A resistor 206 in series with the pair of Zener diodes create a soft-knee characteristic in the limiter. The limiter has a gentle rise and fall, and clamps significantly at the target voltage. Capacitors 210 and 212, resistors 208, 214, 216, and 218 and transistor 220 form a high pass filter leading to the Zener diode limiter. Capacitors 210 and 212 are connected in series between point A and the base of PNP bipolar junction transistor (BJT) 220. The base is also connected to ground through resistor 218 and to voltage source V+ through resistor 214. The base of BJT 220 is connected to ground. The emitter of BJT 220 is connected to V+ through resistor 216, to the junction between capacitors 210 and 212 through resistor 208 in a feedback path, and to resistor 206 through resistor 221. A capacitor 222 can be placed between the emitter of BJT 220 and point B to bypass high and mid frequencies from the illustrated limiter circuit so that they are not affected.

The frequency selective soft-knee peak limiter has two effects on an audio signal. First, it reduces any low-frequency thumps caused by hitting the top of the guitar with too much force. Secondly, it allows the low end to instantaneously compress and release as the guitar is strummed harder and then softer. This is tuned to mimic the low frequency clamping that is done mechanically by the body and mechanics of the instrument and keeps the tone tight in the sub low frequencies when played lightly. Although a specific implementation of a soft-knee peak limiter is discussed above, one skilled in the art will recognize that a soft-knee peak limiter in accordance with embodiments of the invention can be implemented in any of a variety of ways. One skilled in the art will also recognize that the range of frequencies of audio content designed to be affected by a soft-knee peak limiter may vary depending on the instrument for which the amplification system is intended and the frequency response characteristics of the instrument such as, but not limited to, the fundamental frequencies of vibration of strings and the fundamental resonances of the body of the instrument discussed further above. Low frequencies can also be modified by an RMS compressor to reduce feedback. RMS compressors that can be utilized in a RCBM preamp in accordance with embodiments of the invention are discussed below.

Low Frequency RMS Compressor

An RMS compressor can be used to reduce the potential for "bloom" feedback at the natural resonance frequencies of a guitar or other instrument. In several embodiments of the invention, an RMS compressor includes an RMS detector and a compressor. An RMS (root-mean-square) detector responds to the average of all frequency content over a period of time, i.e., the average energy, as opposed to a peak value being reached at any given time.

In many embodiments, the compressor is designed to be fast acting (i.e., having quick attenuation above the threshold) and slow releasing with a soft knee. This is desirable to track the dynamics of an acoustic guitar or other acoustic instrument. The compressor is used to change the complexity of content at low frequencies by adding a small amount of non-linearity to the low end that results in added harmonics in the midrange and better resistance to feedback. The compressor is run by an RMS detector as opposed to a peak limiter so that it acts much more quickly on strummed chords than on individual notes. This allows the compressor to ride with the dynamics of the notes being played without clamping the energy and musicality of the note. In several embodiments of the invention, the RMS compressor is used with a single pole bypass filter or similar means to affect frequencies at and below 200 Hz.

In many embodiments of the invention, an RMS compressor includes an RMS detector using diodes and an op-amp and a compressor using a JFET (junction gate field effect transistor). An RMS compressor including an RMS detector and a compressor in accordance with embodiments of the invention is illustrated conceptually in FIG. 5 and in detail in FIG. 6.

Figure 6:
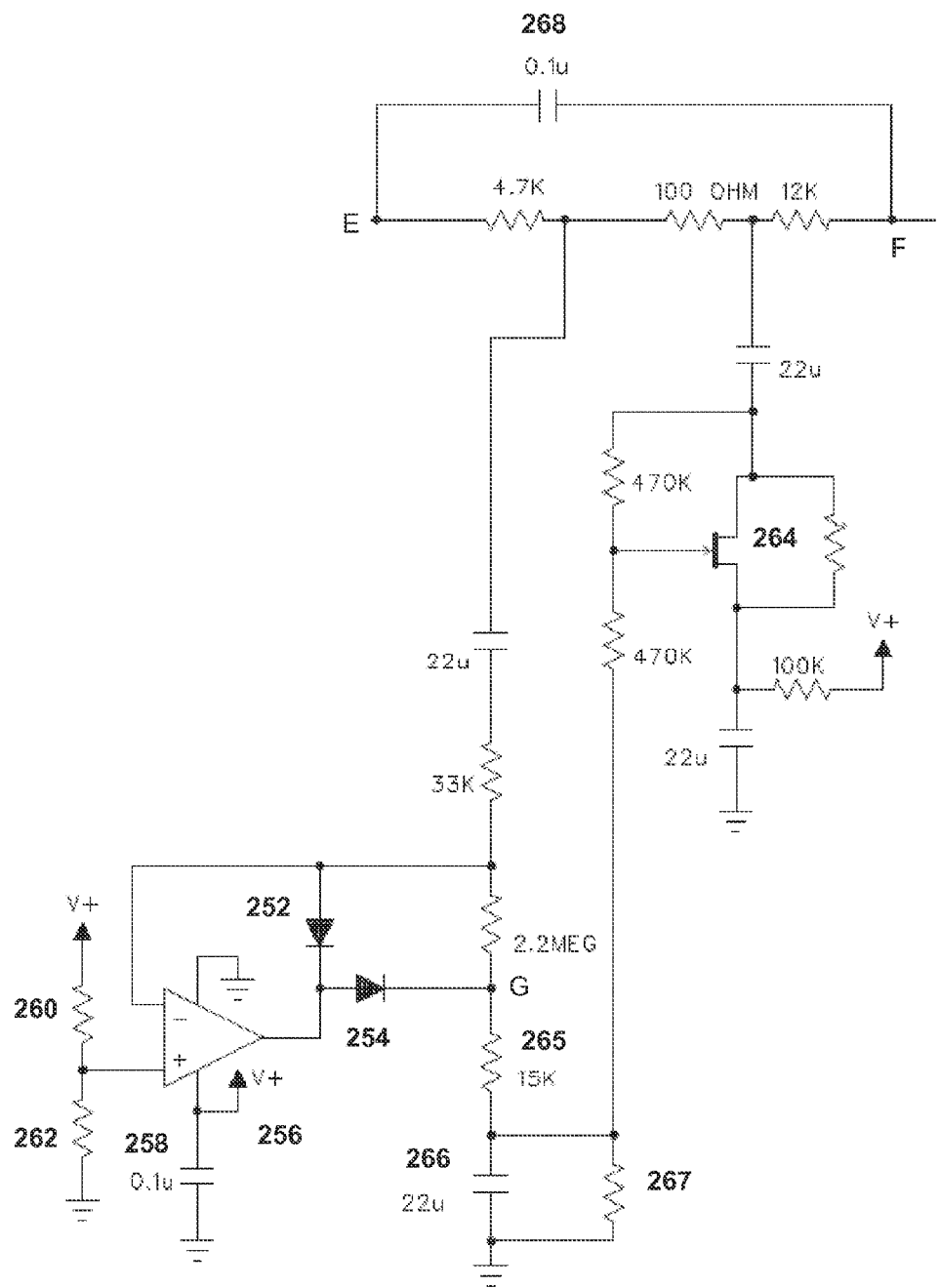
FIG. 6 is a circuit diagram illustrating a low frequency RMS compressor that can be used in a preamp in accordance with an embodiment of the invention.

Referring now to FIG. 6, an AC signal is converted to a DC signal and then an RMS DC signal by the RMS detector portion of the circuit that includes diodes 252 and 254 and op-amp 256. The anode of diode 252 is connected to the inverting input of op-amp 256 and the cathode of diode 252 is connected to the output of the op-amp and to the anode of diode 254. The cathode of diode 254 is connected to point G. Op-amp 254 has a capacitor 258 in line with its voltage source V+. The non-inverting input of op-amp 254 is connected to V+ through resistor 260 and to ground through resistor 262.

The two diodes 252 and 254 act as a full wave precision rectifier that converts the signal to DC. Providing the signal as negative feedback to the inverting input of the op-amp 256 converts the signal to an RMS DC signal, which is compared to the voltage at the non-inverting input of the op-amp where two resistors 260 and 262 are configured to create a voltage divider. The output RMS DC signal switches JFET 264 on and off. In the illustrated embodiment, JFET 264 has a variable bandwidth to attenuate the selected frequencies although this is not always necessary or desirable. Capacitor 266 and resistors 265 and 267 in the path from point G to the gate of JFET 264 control the speed of switching of the JFET 264.

A capacitor 268 can be used in parallel with the RMS compressor circuit from points E to F to bypass high and mid frequencies from the RMS compressor circuit. Although a specific implementation of an RMS compressor circuit is discussed above, one skilled in the art will recognize that an RMS compressor circuit in accordance with embodiments of the invention can be implemented in any of a variety of ways. One skilled in the art will also recognize that the range of frequencies of audio content designed to be affected by an RMS compressor circuit may vary depending on the instrument for which the amplification system is intended and the frequency response characteristics of the instrument such as, but not limited to, the fundamental frequencies of vibration of strings and the fundamental resonances of the body of the instrument discussed further above. Mid frequency compressors in accordance with embodiments of the invention are discussed below.

Upper Mid and High Frequency Shaping: Mid Frequency Compressor and Shelving Filter An acoustic guitar or other instrument utilizing an RCBM or other pickup such as other types of microphones or sound board transducers (SBTs) may have the potential to sound harsh at certain high frequencies without equalization or compression. In various embodiments of the invention, a preamplifier system for an RCBM or other type of pickup utilizes a mid frequency compressor and/or shelving filter to modify the high frequency content of the audio signal to improve the sound quality. Some mid frequencies such as the range 250 Hz-3 kHz are desirable and are bypassed from all processing (as by capacitors 222 and 268 discussed above). Furthermore, some treble frequencies such as 10 kHz and above can be bypassed using an RC filter. An RC filter to bypass treble frequencies in accordance with embodiments of the invention is illustrated in FIG. 9. The RC filter includes capacitor 352 and resistor 354 placed in parallel and affects frequencies at approximately 10 kHz and above. In many embodiments of the invention, an RC filter circuit can contribute to setting the frequency ranges of a mid frequency compressor and/or shelving filter as will be discussed below. In certain embodiments that include both a mid frequency compressor and shelving filter, a single RC filter circuit can be used to affect both the compressor and shelving filter. Although specific compressor and shelving filter circuits are discussed below, an instrument amplification system in accordance with embodiments of the invention may include any of a variety of equalization circuitry to limit the dynamic range and/or level of audio content at certain frequencies or frequency ranges to provide for more accurate and/or subjectively pleasing sound reproduction. Specific implementations of equalization circuitry may vary for different types of stringed acoustic musical instruments.

Mid Frequency Compressor

Human ears are typically most efficient at perceiving sounds around 3 kHz and are sensitive to high volumes in a band adjacent 3 kHz. Loud sounds in that range can be perceived as extremely harsh. In various embodiments of the invention, a mid frequency compressor is utilized that is very band selective at around 3 kHz and/or generally affects frequencies in the band 3-6 kHz, but primarily 5-6 kHz.

Figure 7:
FIG. 7 is a conceptual diagram illustrating a mid frequency compressor that can be used in a preamp in accordance with embodiments of the invention.

In many embodiments of the invention, an op-amp is used in a gyrator circuit that simulates an RLC bandpass filter in the RCBM preamp. A pair of reverse parallel diodes can be placed before the gyrator to attenuate the signal as a compressor, or dynamic band-reject filter. A compressor circuit that includes an op-amp and diodes in accordance with embodiments of the invention is illustrated conceptually in FIG. 7 and in detail in FIG. 8. In the circuit illustrated in FIG. 8, the capacitor 302 forms an RC differentiating circuit with resistor 304 such that the voltage across resistor 304 behaves similar to the voltage across an inductor over time. The effect of the capacitor is inverted and multiplied as op-amp 308 buffers this voltage and applies it back to the input through resistor 306. The circuit is effectively a frequency selective limiter. Together with a resistor 352 and a capacitor 354 in parallel placed before the diodes 310 and 312, the gyrator acts as an RL bandpass filter and is made level specific by reverse parallel diodes 310 and 312 that limit the AC signal. Moreover, the impedance of the diodes changes with the level of the signal, which shifts the width of the affected frequency band. The result is a dynamic filter that is very strong and narrow at high levels and more soft and subtle at lower levels. Although a specific implementation of a mid frequency compressor circuit is discussed above, one skilled in the art will recognize that a mid frequency compressor circuit in accordance with embodiments of the invention can be implemented in any of a variety of ways. One skilled in the art will also recognize that the range of frequencies of audio content designed to be affected by a mid frequency compressor circuit may vary in view of the sensitivity of human hearing discussed further above. Circuitry that can be utilized in a RCBM preamp to modify upper mid and high frequencies are discussed below.

Shelving Filter

A shelving filter can be used to tame upper mid frequencies. In many embodiments of the invention, an RCBM preamp includes a single pole shelving filter that affects frequencies in the range of 1 kHz to 20 kHz. The higher the signal value (i.e., voltage), the more the shelving filter reduces content in the 5 kHz to 6 kHz range. In many embodiments of the invention, a shelving filter including capacitors and resistors can be utilized in a RCBM preamp. A single pole shelving filter using capacitors and resistors in accordance with embodiments of the invention is illustrated in FIG. 10. The shelving filter includes a capacitor 402 and a resistor 404 in series to ground. The circuit also includes a capacitor 352 and resistor 354 in parallel placed before the capacitor 402. Resistor 354 forms a voltage divider against the combined impedance of the capacitor 402 and resistor 404, which is selectively bypassed by the capacitor 352. Although a specific example of a shelving filter is illustrated in FIG. 10, any of a variety of shelving filter can be utilized in accordance with embodiments of the invention. One skilled in the art will recognize that the range of frequencies of audio content designed to be affected by a shelving filter may vary subject to the application for which the amplification system is intended.

Trim Control

As discussed above, lower frequencies from a pickup source such as an RCBM can be modified using compressors to reduce feedback and improve the accuracy of the sound signal. In some situations, the compression can result in an imbalance between lower frequencies and higher frequencies. In many embodiments of the invention, a trim control is provided to modify the level of higher frequencies to bring them back into balance with low frequencies that are subjected to compression and/or other effects as discussed further above. The trim control can be a trim potentiometer with a capacitor or other mechanism for adjusting levels. As individual microphones and other types of pickups can have different characteristics and individual instruments (even those created according to a common design) can sound differently, the trim control may be designed to be adjustable after installation by an accessible control means such as a wheel or knob to tailor the amplified sound of a particular instrument. In several embodiments of the invention, a trim control used in a RCBM preamp affects content at all frequencies above 1 kHz, but mostly in the range 3 kHz to 10 kHz.

A trim control circuit in accordance with embodiments of the invention is illustrated in FIG. 11. A capacitor 452 is connected in series to a potentiometer 454 or other means for physical control leading from the main signal path to ground. A resistor 456 is placed in series with the main signal path before capacitor 452. The effect of capacitor 452 on the signal is varied by the potentiometer 454 such that content at frequencies in the target frequency range is attenuated or reduced to an extent set by the potentiometer. Various embodiments of the invention can optionally include a volume control potentiometer 456 between the main signal path and ground that affects the strength of the entire signal. Although a specific example of a trim control circuit is illustrated in FIG. 11, any of a variety of trim control circuits can be utilized in accordance with embodiments of the invention. One skilled in the art will recognize that the range of frequencies of audio content designed to be affected by a trim control may vary subject to the application for which the amplification system is intended.

Notch Filter

Figure 12:
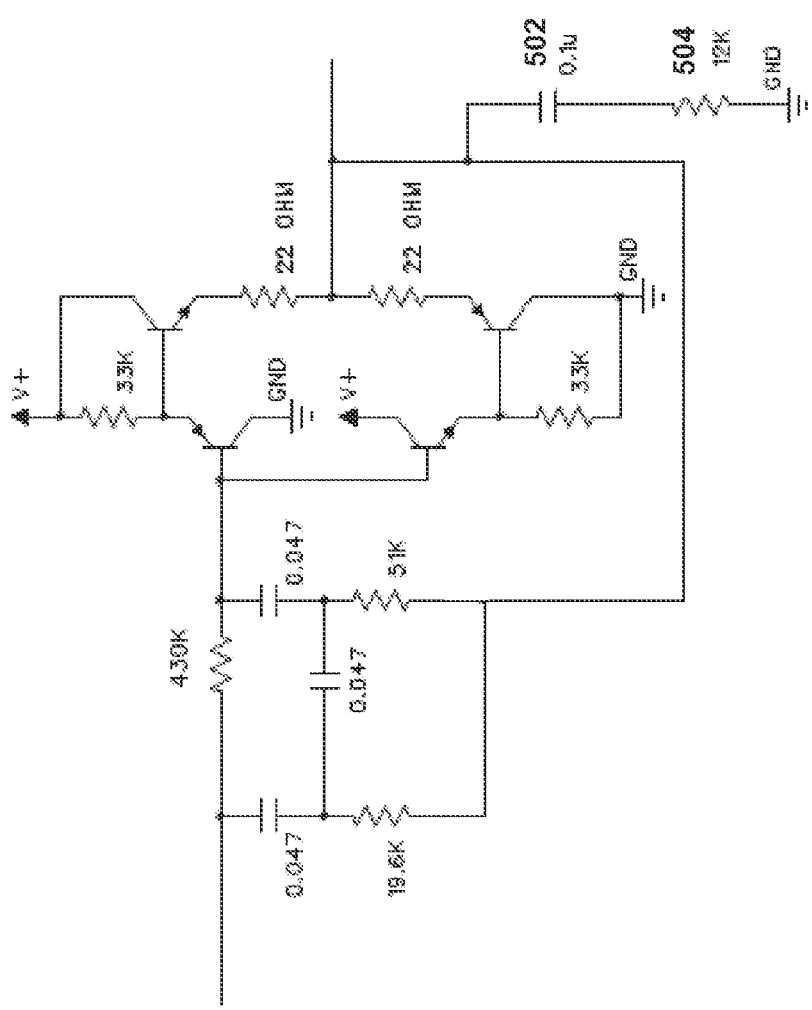
FIG. 12 is a circuit diagram illustrating a notch filter that can be used in a preamp in accordance with an embodiment of the invention.

In several embodiments of the invention, an RCBM preamp includes a notch filter designed to significantly remove signal content around 60 to 65 Hz. The notch filter may also be a buffer circuit that provides a low impedance output. A notch filter circuit that can be utilized in a RCBM preamp in accordance with embodiments of the invention is illustrated in FIG. 12. A capacitor 502 and a resistor 504 can be chosen to tune the notch response for loading purposes, and do not do significant frequency selection. The filter has a hard knee to cut down ringing caused by feedback. In other embodiments, any of a variety of filters can be utilized as appropriate to the requirements of a specific application.

In many embodiments of the invention, preamplifier circuitry utilizes class A discrete components and is powered by a 9V battery or similar power source. While the circuitry described above includes specific arrangements of resistors, capacitors, diodes, op-amps, and transistors, one skilled in the art will recognize that other types of electronics components may be utilized with similar effect in accordance with embodiments of the invention.

While the above description contains many specific embodiments of the invention, these should not be construed as limitations on the scope of the invention, but rather as an example of one embodiment thereof. Accordingly, the scope of the invention should not be limited to the specific embodiments illustrated.

What is claimed is:

1. An instrument amplification system, comprising:
    a microphone mounted to a stringed acoustic musical instrument and configured to generate an audio signal based upon acoustic waves within the interior of the stringed acoustic musical instrument, wherein the audio signal comprises audio content within a plurality of frequency bands including at least:
        a low frequency band that includes a fundamental resonant frequency of the stringed acoustic musical instrument;
        a middle frequency band that includes frequencies higher than the frequencies of the low frequency band and includes at least one harmonic frequency of the stringed acoustic musical instrument; and
        an upper frequency band that includes frequencies higher than the frequencies of the middle frequency band;
        wherein the frequency response characteristics of acoustic waves generated within the stringed acoustic musical instrument in at least the low frequency band differ from the frequency response characteristics of acoustic waves generated outside of the stringed acoustic musical instrument in the same frequency band due to reverberation of acoustic waves within the low frequency band within the stringed acoustic musical instrument; and
    an electronic preamplifier system configured to:
        receive the audio signal;
        provide portions of the audio signal to a plurality of amplification circuits, where audio content within one of the plurality of frequency bands in the audio signal is provided to each amplification circuit; and
        combine the outputs of the amplification circuits into an output signal;
        wherein the audio content within the low frequency band is provided to a low frequency band amplification circuit from the plurality of amplification circuits that applies frequency specific compression to the given frequency band to provide audio content in the low frequency band having dynamic frequency response characteristics corresponding to the dynamic frequency response characteristics of acoustic waves generated outside of the stringed musical instrument in the low frequency band.

2. The instrument amplification system of claim 1, wherein the microphone is configured to be mounted inside the chamber of the stringed acoustic musical instrument.

3. The instrument amplification system of claim 1, wherein the microphone includes a capsule configured to be mounted within the pressure zone of a vibrating surface of the stringed acoustic musical instrument.

4. The instrument amplification system of claim 3, wherein the microphone capsule comprises a reflection cancelling boundary microphone (RCBM).

5. The instrument amplification system of claim 4, wherein the middle frequency band includes the primary resonant frequency of the microphone capsule.

6. The instrument amplification system of claim 4, wherein the microphone capsule is mounted to an inside surface of the stringed acoustic musical instrument.

7. The instrument amplification system of claim 1, wherein the electronic preamplifier system is mounted to the stringed acoustic musical instrument.

8. The instrument amplification system of claim 1, wherein the electronic preamplifier system is not mounted to the stringed acoustic musical instrument.

9. The instrument amplification system of claim 1, wherein the low frequency band amplification circuit includes a soft knee limiter.

10. The instrument amplification system of claim 1, wherein the middle frequency band includes the 3-6 kHz frequency band and the corresponding amplification circuit from the plurality of amplification circuits includes a compressor to reduce the dynamic range of audio content in the 3-6 kHz frequency band.

11. The instrument amplification system of claim 1, wherein:
    the audio signal further comprises audio content within:
        a second low frequency band that includes frequencies higher than the frequencies of the low frequency band; and
        a second middle frequency band that includes frequencies higher than the frequencies of the second low frequency band and lower than the frequencies of the middle frequency band; and
    the plurality of amplification circuits comprise:
        a soft knee peak limiter that reduces the dynamic range of audio content within the low frequency band;
        a soft knee root-mean-square compressor that reduces the dynamic range of audio content within the second low frequency band;
        a middle frequency compressor that reduces the dynamic range of audio content within the second middle frequency band; and
        a shelving filter that provides a fixed reduction in the level of audio content within the middle frequency band.

12. The instrument amplification system of claim 11, wherein:

the plurality of amplification circuits further comprises a first high pass filter and a first high and middle frequency bypass, where:
the high pass filter is configured to receive a portion of the audio signal and send a filtered audio signal to the soft knee peak limiter and the high and middle frequency bypass; and
the first high and middle frequency bypass is configured to receive a filtered audio signal from the high pass filter and bypass a band of high and middle frequencies of the filtered audio signal from entering the soft knee limiter.

13. The instrument amplification system of claim 12, wherein the high pass filter has a cutoff of 70 Hz and the first high and middle frequency bypass has a cutoff of 250 Hz.

14. The instrument amplification system of claim 12, wherein:
the plurality of amplification circuits further comprises a second high and middle frequency bypass, where:
the soft knee root-mean-square compressor and the second high and middle frequency bypass are configured to accept a modified audio signal from the soft knee peak limiter; and
the second high and middle frequency bypass is configured to bypass audio content within a band of high and middle frequencies of the modified audio signal from entering the soft knee root-mean-square compressor.

15. The instrument amplification system of claim 14, wherein the second high and middle frequency bypass has a cutoff of 200 Hz.

16. The instrument amplification system of claim 14, wherein:
the plurality of amplification circuits further comprises a very high frequency bypass, where:
the mid frequency compressor is configured to accept a modified audio signal from the soft knee root-mean-square compressor; and
the very high frequency bypass is configured to bypass audio content within a band of very high frequencies from entering the middle frequency compressor and the shelving filter.

17. The instrument amplification system of claim 16, wherein the very high frequency bypass has a cutoff of 10 kHz.

18. The instrument amplification system of claim 16, wherein the plurality of amplifications circuits further comprises a middle frequency bypass configured to bypass audio content within frequencies in a passband of 250 Hz to 3 kHz from entering the middle frequency compressor and the shelving filter.

19. The instrument amplification system of claim 11 wherein the stringed acoustic musical instrument is a six string acoustic guitar and at least a portion of the low frequency band falls within the frequency range of 70 Hz to 250 Hz.

20. The instrument amplification system of claim 11 wherein the soft knee peak limiter comprises a first Zener diode that is reverse biased against a second Zener diode and a resistor in series.

21. The instrument amplification system of claim 11 wherein the stringed acoustic musical instrument is a six string acoustic guitar and at least a portion of the second low frequency band falls within the frequency range of 70 Hz to 200 Hz.

22. The instrument amplification system of claim 11 wherein the soft knee root-mean-square compressor comprises:
an op-amp having a constant voltage at its non-inverting input;
a first diode and a second diode forming a precision rectifier joining the output and inverting input of the op-amp; and
a junction gate field effect transistor (JFET), wherein the state of the JFET is based on the output of the second diode.

23. The instrument amplification system of claim 11 wherein the stringed acoustic musical instrument is a six string acoustic guitar and at least a portion of the second middle frequency band falls within the frequency range of 3 to 6 kHz.

24. The instrument amplification system of claim 11 wherein the middle frequency compressor comprises:
a first diode that is reverse biased against a second diode in parallel; and
a gyrator circuit comprising an op-amp with an RC differentiating circuit connected to the non-inverting input of the op-amp.

25. The instrument amplification system of claim 11 wherein the stringed acoustic musical instrument is a six string acoustic guitar and at least a portion of the middle frequency band falls within the frequency range of 1 kHz to 20 kHz.

26. The instrument amplification system of claim 11 wherein the shelving filter comprises:
a first resistor and a first capacitor in parallel; and
a second resistor and a second capacitor in series.

27. The instrument amplification system of claim 11 wherein:
the audio signal further comprises audio content within a third middle frequency band, wherein at least a portion of the third middle frequency band falls within the frequency range of 50 to 65 Hz; and
the instrument amplification system further comprises a notch filter that significantly reduces the level of audio content within the seventh middle frequency band.

28. The instrument amplification system of claim 1 further comprising a trim control comprising a trim potentiometer and capacitor configured to adjust the level of audio content in the upper frequency band relative to the level of audio content in the low frequency band and the middle frequency band.

29. The instrument amplification system of claim 1 wherein:
the frequency response characteristics of acoustic waves generated within the stringed acoustic musical instrument in at least the middle frequency band differ from the frequency response characteristics of acoustic waves generated outside of the stringed acoustic musical instrument in the same frequency band due to reverberation of acoustic waves within the middle frequency band within the stringed acoustic musical instrument; and
the audio content containing the middle frequency band is provided to a middle frequency band amplification circuit from the plurality of amplification circuits that applies frequency specific compression to the given frequency band to provide audio content in the middle frequency band having frequency characteristics corresponding to the frequency response characteristics of acoustic waves generated outside of the stringed musical instrument in the middle frequency band.

30. The instrument amplification system of claim 29 wherein the middle frequency band amplification circuit from the plurality of amplification circuits also applies frequency specific limiting to the middle frequency band to provide audio content in the middle frequency band having frequency characteristics corresponding to the frequency response characteristics of acoustic waves generated outside of the stringed musical instrument in the middle frequency band.

31. The instrument amplification system of claim 1 wherein the low frequency band amplification circuit from the plurality of amplification circuits also applies frequency specific limiting to the low frequency band to provide audio content in the low frequency band having frequency characteristics corresponding to the frequency response characteristics of acoustic waves generated outside of the stringed musical instrument in the low frequency band.

\* \* \* \* \*